(12) United States Patent
Bloker

(10) Patent No.: US 6,172,925 B1
(45) Date of Patent: Jan. 9, 2001

(54) MEMORY ARRAY BITLINE TIMING CIRCUIT

(75) Inventor: Raymond E. Bloker, San Jose, CA (US)

(73) Assignee: Transmeta Corporation, Santa Clara, CA (US)

(*) Notice: Under 35 U.S.C. 154(b), the term of this patent shall be extended for 0 days.

(21) Appl. No.: 09/333,178

(22) Filed: Jun. 14, 1999

(51) Int. Cl.[7] .................................................. G11C 7/02
(52) U.S. Cl. ............................................. 365/210; 365/203
(58) Field of Search .................................. 365/210, 203, 365/233, 233.5, 207

(56) References Cited

U.S. PATENT DOCUMENTS

| | | | |
|---|---|---|---|
| 5,881,008 | * 3/1999 | Becker | 365/210 |
| 5,883,834 | * 3/1999 | Becker et al. | 365/185.21 |
| 5,966,338 | * 3/1999 | Liu et al. | 365/207 |

* cited by examiner

Primary Examiner—David Nelms
Assistant Examiner—David Lam
(74) Attorney, Agent, or Firm—Stephen L. King

(57) ABSTRACT

A circuit for generating timing signals for clocking the sensing amplifiers of a SRAM memory array having a plurality of memory cells joined in rows by wordlines and in columns by bitlines including a dummy bitline, a plurality of dummy memory cells joined to the dummy bit column, means for accessing a plurality of the dummy memory cells in parallel to generate a bitline charging current significantly greater than a bitline charging current in a typical operative column of the SRAM memory array, a circuit responsive to current in the dummy bitline for generating a timing signal to sense amplifiers for generating output signals from the operative columns of the SRAM.

17 Claims, 4 Drawing Sheets

MEMORY ARRAY BITLINE TIMING CIRCUIT

BACKGROUND OF THE INVENTION

1. Field of the Invention

This invention relates to memory systems and, more particularly, to circuitry for accurately clocking data from static random access memory.

2. History of the Prior Art

A static random access memory (SRAM) array stores data for use by some form of digital processing apparatus. A typical use of such memory is as some form of cache memory for a microprocessor. Such memories are typically used to provide data to a microprocessor because they can be accessed much more rapidly than main memory. Consequently, as processor speeds increase, the speed at which a static random access memory can be accessed must also increase.

In order to read data in an SRAM array, an interrogating signal is placed on a wordline connecting to the memory cells of a particular row of the memory and wordlines are placed in an interrogating condition. This causes signals to be placed on bitlines connecting to the columns being interrogated. The bitline signals are detected by sense amplifiers associated with each column. Typically, the memory cell data develops very slowly, and sense amplifiers are utilized to accelerate this operation. A clock activates the sensing amplifiers after a period from the initiation of the interrogation signals chosen to allow a sufficient signal to develop at each sense amplifier, and the signal developed by each sense amplifier is clocked to its output.

As the speed of operation of computers increases, the speed at which data must be read from the sense amplifiers increases so that the time at which the clock signals are applied becomes critical. If the timing signal appears too soon before the signals on the bitlines have had time to develop correctly, incorrect output signals can be produced. If the timing signal appears too late, then the performance of the microprocessor slows. As a practical matter, the speed of operation of computer microprocessor circuits has become so rapid that it is quite difficult to generate accurate timing signals for SRAM memories.

This becomes a particularly difficult problem when SRAM memory arrays for a microprocessor are produced by different manufacturers. The particular processes used in manufacturing a SRAM array define the signal transit times through the array and the time required to build sufficient signal level at the sensing amplifiers of the array. Different manufacturing processes often produce arrays which respond quite differently. An array produced by one process may function correctly with a particular processor while an apparently identical array produced by another process may not function at all with the processor.

It is desirable to provide a new circuit for generating very accurate timing signals for the sensing amplifiers of SRAM memory arrays.

SUMMARY OF THE INVENTION

The present invention is realized by a circuit for generating timing signals for clocking the sensing amplifiers of a SRAM memory array having a plurality of memory cells joined in rows by wordlines and in columns by bitlines comprising a dummy bitline, a plurality of memory cells joined to the dummy bit column, means for accessing a plurality of the memory cells in parallel to generate a bitline charging current significantly greater than a bitline charging current in a typical operative column of the SRAM memory array, a circuit responsive to current in the dummy bitline for generating a timing signal to sense amplifiers for generating output signals from memory cells of operative columns of the SRAM.

These and other features of the invention will be better understood by reference to the detailed description which follows taken together with the drawings in which like elements are referred to by like designations throughout the several views.

DETAILED DESCRIPTION

Figure 1:
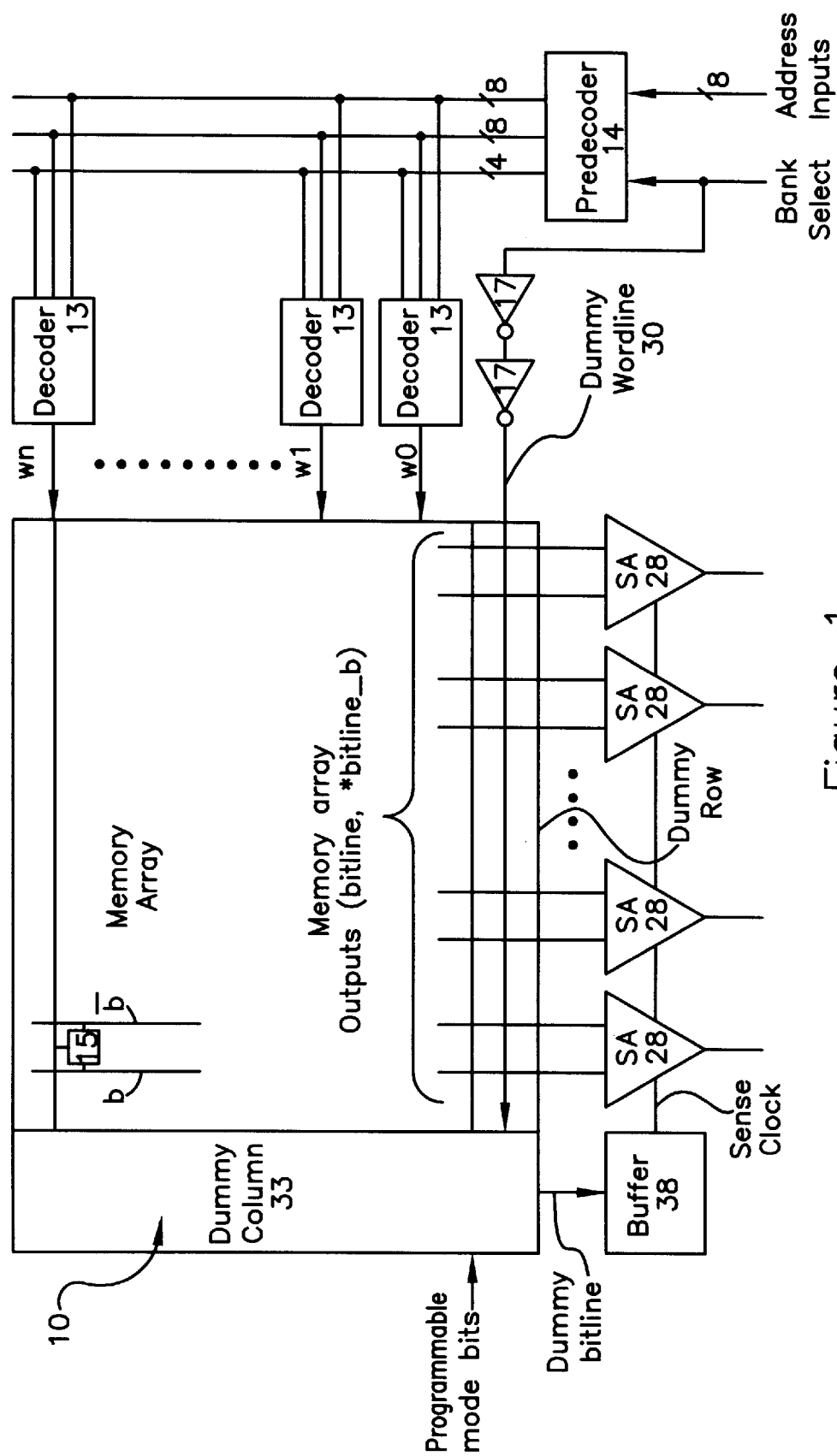
FIG. 1 is a block diagram of one embodiment of a memory array designed in accordance with the present invention.

Referring now to FIG. 1, there is illustrated a block diagram of a memory array 10 designed in accordance with the present invention. One use for such a memory array is as a cache for storing data or instructions for immediate use by a microprocessor. Cache memories which are a part of a microprocessor are typically static random access memory (SRAM) arrays adapted to provide very fast access times to allow the microprocessor to attain high operating rates.

An SRAM array 10 typically includes a plurality of memory cells 15 arranged in rows and columns. The array 10 illustrated in FIG. 1 provides signals to each of the memory cells 15 on wordlines $w_0$–$w_n$. Each such wordline is connected to the memory cells 15 of one row of the array. A particular wordline is selected using addressing signals provided to an associated wordline decoder circuit 13 by a predecoder circuit 14. The predecoder is provided bank select and address input signals from which signals selecting the particular bank of the array and the addressed wordline are generated. Signals are read from the cells 15 of the array 10 through a pair of column conductors which produce complementary binary values (and are therefore designated bitline and bitline bar) connected to the memory cells 15 in each column. The pair of signals read from each column is furnished to a sense amplifier which detects and amplifies the difference of the output signals for that column.

Figure 2:
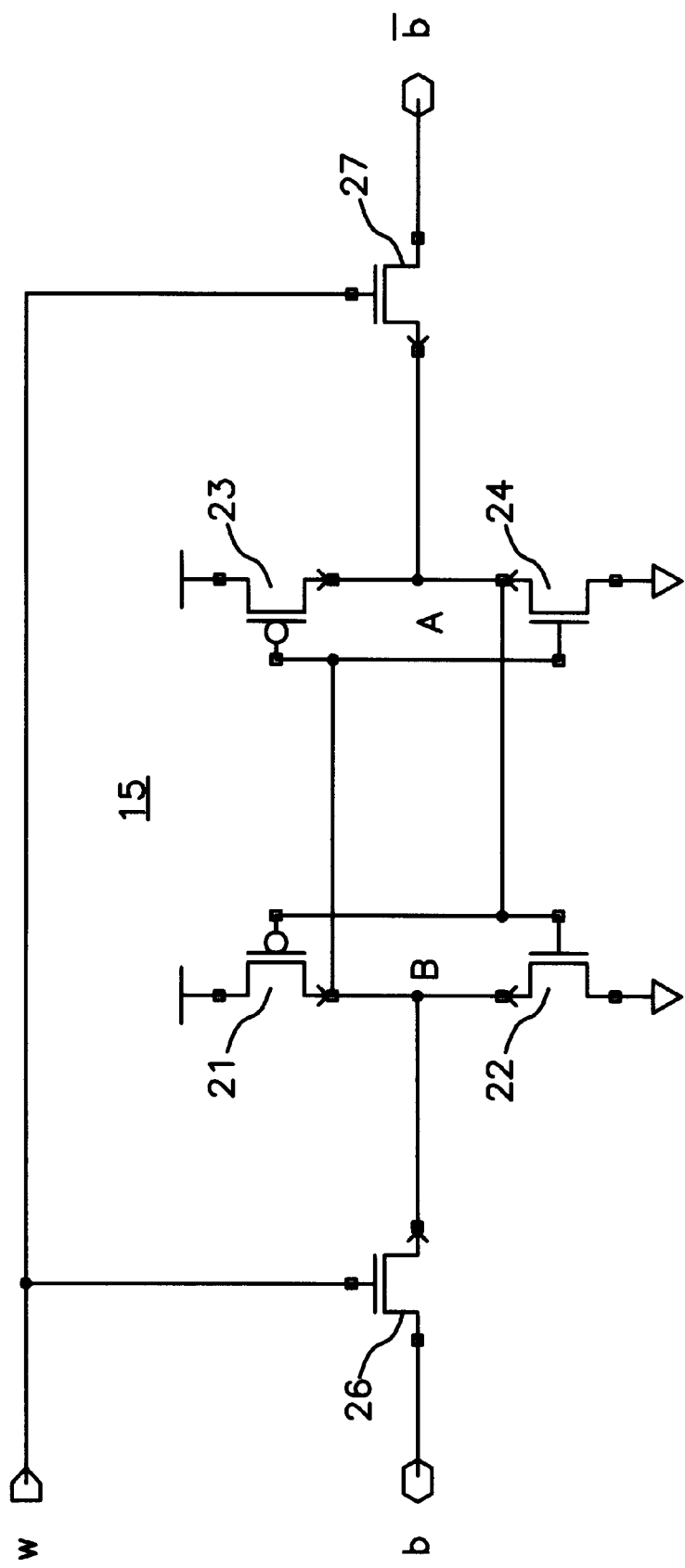
FIG. 2 is a circuit diagram of a typical SRAM memory cell.

FIG. 2 is a circuit diagram illustrating one SRAM memory cell 15. The cell 15 includes a P type field effect transistor (fet) device 21 having its source terminal connected to a source of positive voltage, its drain terminal connected to the drain terminal of a N type fet device 22 the source terminal of which connects to ground. The cell 15 also includes another P type fet device 23 similarly connected with another N type fet device 24 between the source of positive voltage and ground. The gate terminals of the devices 21 and 22 are joined together and to a node A between the drain terminals of the devices 23 and 24. Similarly, the gate terminals of the devices 23 and 24 are joined together and to a node B between the drain terminals of the devices 21 and 22. These four transistors form the memory portion of the cell 15.

A pair of N type fet devices 26 and 27 provide access to the cell 15. The gate of each device 26 and 27 is connected to a wordline of one particular row of the array. The source and drain terminals of the device 26 are connected between the bitline column conductor for the particular column of the array and node B. The source and drain terminals of the device 27 are connected between the bitline bar column conductor for the particular column of the array and the node A.

To write to the cell 15, a high value is placed on one of the bitline or bitline bar conductors, a low value is placed on the other column conductor, and the devices 26 and 27 are enabled by applying a high value on the wordline. For example, to write a zero to the cell, ground is placed on the bitline and a higher voltage on the bitline bar. Ground on the bitline transfers a low voltage through the device 26 to node B and thus to the drains of the devices 21 and 22 and to the gates of the devices 23 and 24. A high voltage on the bitline bar is transferred by the device 27 to node A and thus to the drains of the devices 23 and 24 and to the gates of the devices 21 and 22. These voltages are rapidly latched at the nodes by the latching action of the memory cell. The high voltage at the gates of the devices 21 and 22 turns on the device 22 and turns off the device 21. The low voltage at the gates of the devices 23 and 24 turns on the device 23 and turns off the device 24. When the voltage on the word line is removed, node B remains close to ground and node A remains close to the source voltage.

To read the cell 15, the bitline and the bitline bar conductors are both forced to a high value (precharged), and the wordline is again driven high enabling the devices 26 and 27. The node which is at a low value (node B in the exemplary case) provides a path to ground through the associated N type memory device (here, device 22) which tends to force the connected column conductor (the bitline) to discharge. The high voltage at the other node (node A) and lack of a discharge path through the associated N type device (here, device 24) maintains the other column conductor (bitline bar) at the high voltage level. Thus, the bitline and the bitline bar conductors carry opposite valued binary signals. These two values are applied to two inputs of a sense amplifier 28 which senses the output of one column of the array 10.

The sense amplifier 28 in FIG. 1 receives the input values on the bitline and the bitline bar. At a time selected to match the operation of the circuitry associated with the array 10, a sense amplifier clock signal is received. This clock signal causes the sense amplifier 28 to detect the difference between the two values as one or the other of the column conductors goes toward ground. The difference detected generates an output which is indicative of the condition of the particular cell 15 being interrogated.

Since the signal which is measured is the difference between the values on the bitline and bitline bar conductors of the column associated with the cell, the difference value will depend on the time available for discharging either the bitline or the bitline bar conductor. The column conductor signals are quite small so that the receipt of the sense amplifier clock signal too early will often causes a false indication to be generated. If the clock signal is received too late, then the accessing period is simply increased slowing the speed at which the associated circuitry may operate. Consequently, the accurate timing of the clock signal is very important.

In order to provide extremely accurate timing of the sense amplifier clock signals, the present invention provides a number of unique features. First, the array 10 utilizes a dummy wordline 30 (FIG. 1) to transfer bank select signals (used for selecting the particular bank of the memory array 10 being accessed) to a dummy column 33. The dummy wordline 30 is fabricated in the same process as the working wordlines of the array and has the same length. Consequently, the dummy wordline has the same electrical properties as do the other wordlines. The dummy wordline 30 is connected to the bank select input lines by means of a pair of inverters 17 which together provide a delay to partially match the delay through the predecoder 14 and wordline decoder 13 to any wordline. Thus, whenever a wordline is selected by a wordline select signal, a signal is transferred at the same time through the dummy wordline 30.

Figure 3:
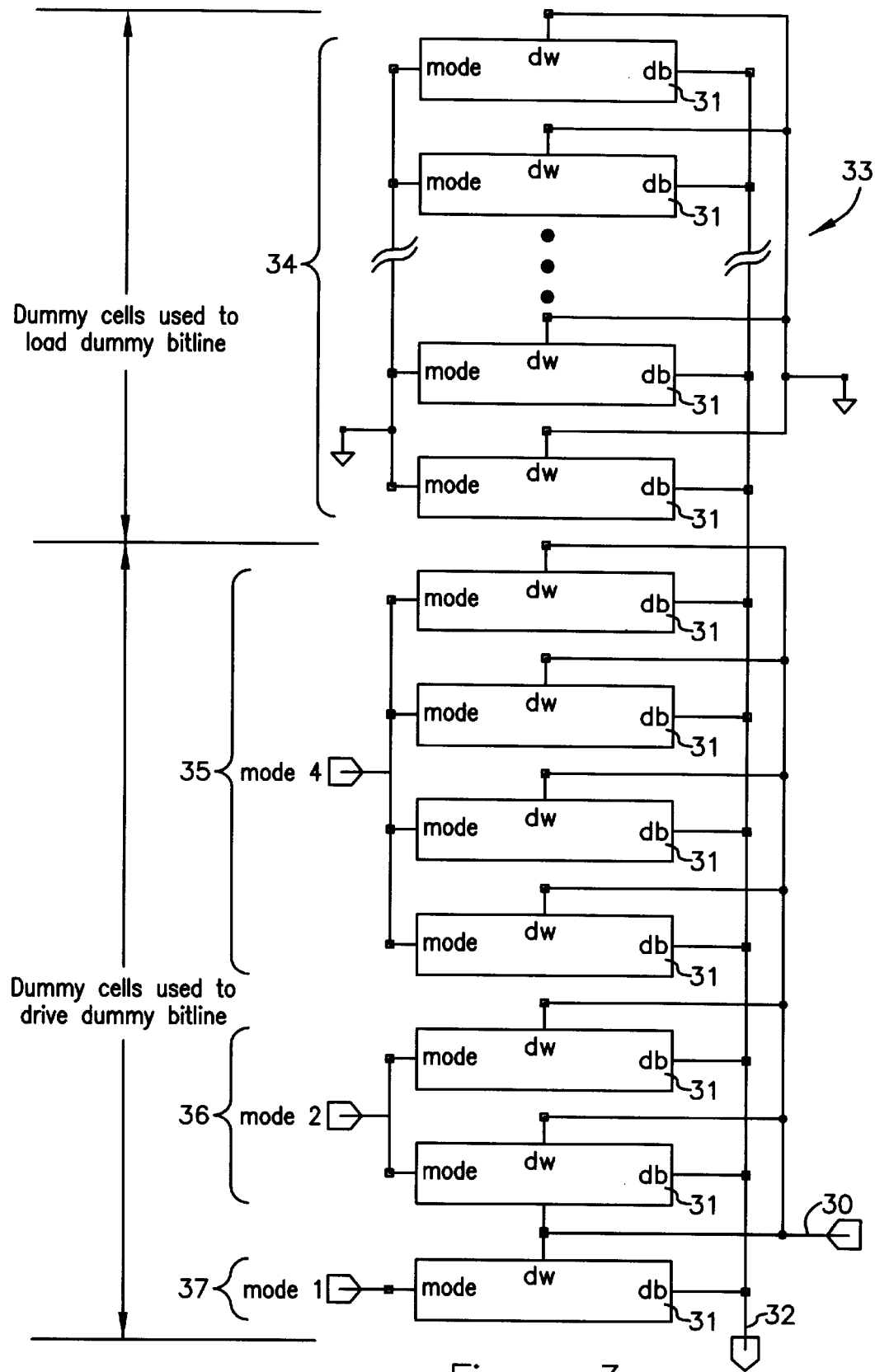
FIG. 3 is a circuit diagram illustrating a portion of a memory array including the present invention.

The signal transferred through the dummy wordline 30 is furnished to the dummy column 33. FIG. 3 is a diagram illustrating one embodiment of a dummy column. As may be seen, the dummy column includes a plurality of dummy memory cells 31. These dummy memory cells are fabricated by the same process as are the operating memory cells 15 joined in the other columns of the array 10 during the manufacture of the array 10. As will be seen, these cells may each include the same number and types of fet transistor devices as do the memory cells 15 described above. Since these dummy cells are manufactured by the same process, the cells provide the same electrical characteristics as do the operating memory cells of the array 10.

The dummy cells 31 of the dummy column 33 are arranged in a number of groups. All of dummy cells of all of the groups are connected to a dummy bitline 32 which provides an input signal for a buffer 38 (see FIG. 1) which generates the sense amplifier clock signal. Each dummy cell of an upper group 34 is biased to remain off by connecting its wordline input and a mode input each to ground. Because these cells remain off, each of these dummy cells of the upper group loads the dummy bitline in a manner identical to any normal operating memory cell of the array which is connected to a wordline that receives no enabling wordline input signal.

Below the upper group 34 of dummy memory cells are three other groups of dummy cells in the embodiment illustrated. The uppermost of these groups 35 includes four dummy memory cells, the next of these groups 36 includes two dummy memory cells, and the lowest of these groups 37 includes a single dummy memory cell. The cells of each of the groups 35, 36, and 37 are connected in parallel to the dummy wordline 30. Each group 35, 36, and 37 is also connected to its own mode input terminal. The combination of a mode input signal and a signal on the dummy wordline activates the dummy memory cells of that group. By selecting one or more particular mode input terminals, the number of cells which are accessed whenever a signal is received on the dummy wordline may be selected. As may be seen, any number from one to seven dummy memory cells may be selected in the particular embodiment by applying mode input signals. Other embodiments having additional groups (e.g., eight, sixteen) of dummy memory cells selectable through mode inputs may be utilized in other embodiments of the invention to provide greater selection for discharging the dummy bitline conductor 32.

In a typical case of operation of the array 10, a high value mode input signal is placed as a control signal for the array 10 at the input terminal for the group or groups selected (e.g., group 35). When the array is read, a wordline signal selects an appropriate wordline and the connected memory cells are accessed to provide output signals on the associated bitline and bitline bar conductors. Simultaneously, the bank select signal is propagated on the dummy wordline 30 to the dummy memory cells 31 of the dummy memory column 33. This signal accesses the dummy memory cells of the group 35. Each of these cells provides a zero value on the dummy bitline. At the same time, the cells of groups 34, 36, and 37 load the dummy bitline as do the normal non-accessed memory cells 15 connected to the functioning columns of the array 10. Thus, the dummy bitline 32 provides a signal path which is loaded essentially identically to an operating bitline. However, the total value of the signal furnished on the dummy bitline is some number of times the value of the signal furnished on an operating bitline. In the case in which the dummy cells of group 35 only are enabled, the signal value is four times the signal furnished on an operating bitline and thus causes the dummy bitline to charge at four times the rate at which an operating bitline charges.

The buffer stage 38 is adapted to provide an output signal at a threshold value in the embodiment being described which is four times that required for a bitline signal in order to generate an output signal to match the higher charging rate. Providing a buffer which responds to an input signal which is much larger than the typical bitline signal value allows a simple type of buffer to be utilized. In one embodiment, the buffer is a ratioed inverter well known to those skilled in the art which functions in an essentially digital manner.

It should be noted that the circuitry of the buffer 38 provides a delay which is not insignificant. To offset this and maintain the timing through the dummy circuitry, the delay provided through the two inverters 17 at the dummy wordline input are reduced by the amount of the delay provided by the buffer. Thus, the overall delay through the dummy circuitry to the output of the buffer matches the delay through the operating wordlines and column conductors to the sense amplifiers. The buffer charges to its discharge value very accurately and provides a clock signal to activate each of the sense amplifiers 28 at essentially the same time as the operating bitline signals on the operating column conductors develop to the correct level.

Figure 4:
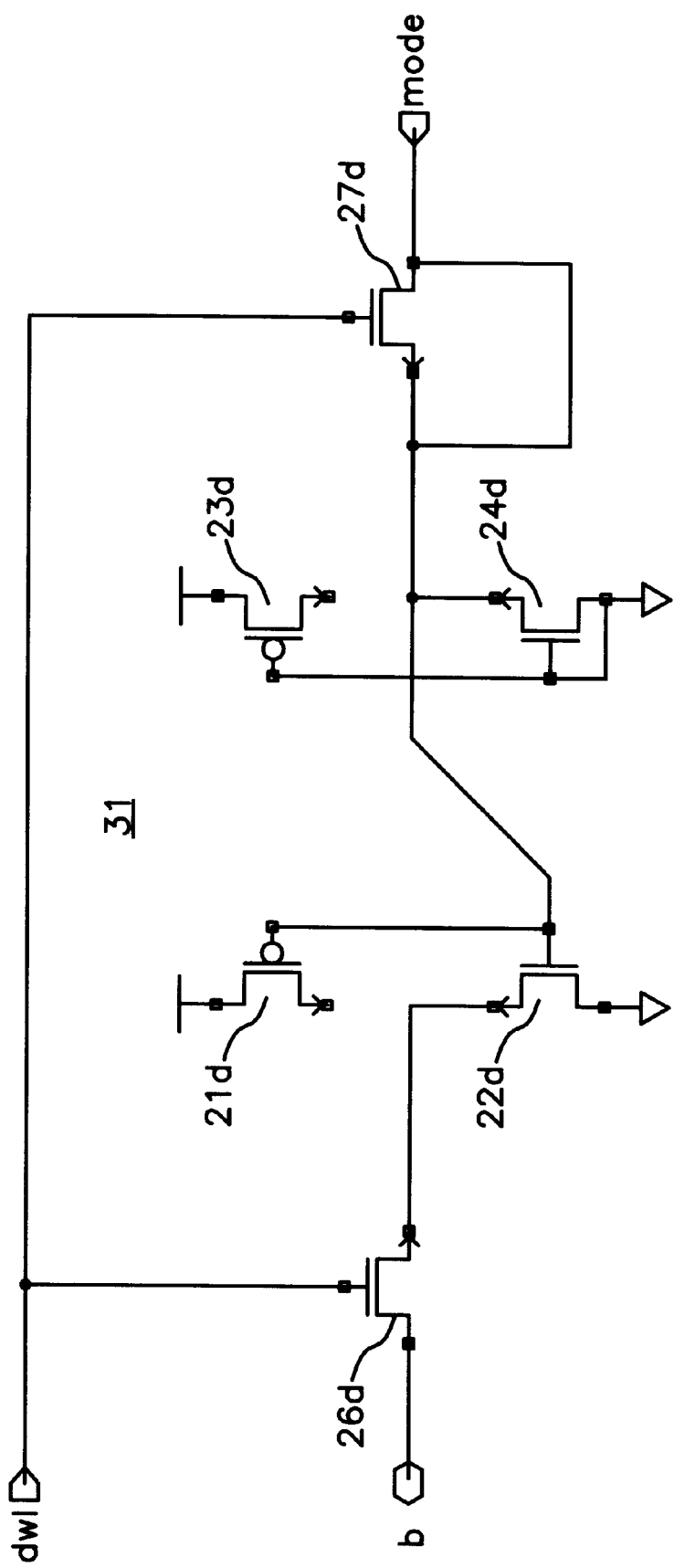
FIG. 4 is a circuit diagram of a dummy cell which may be used in the present invention.

It should be understood that it would be possible to utilize dummy memory cells identical to operating memory cells. However, this would complicate the design because it would then be necessary to actually store values in the dummy cells with the attendant storage cycles. What is necessary is for each of the dummy cells to produce a zero value for discharging the dummy bitline in order to maintain the timing accuracy for the circuitry. To accomplish this in one embodiment of the invention, the dummy memory cells have been modified from the operating memory cell 15 illustrated in FIG. 2. FIG. 4 is a circuit diagram illustrating such a dummy memory cell 31. As may be seen, each dummy memory cell 31 includes a P type field effect transistor (fet) device 21d, a N type fet device 22d, a P type fet device 23d, a N type fet device 24d, and a pair of N type fet devices 26d and 27d. These devices are produced in the same process as and are identical to the fet devices of the operating memory cells which are similarly numbered in FIG. 2. However, these devices are interconnected differently so that whenever a dummy memory cell receives input on the dummy wordline it provides a zero value output on the dummy bitline.

As may be seen, the mode signal to each dummy memory cell 31 is applied at a mode terminal which is in the position of the bitline bar of the typical operating memory cell. The value furnished at the mode terminal is transferred by a conductor which shorts the terminals of the fet device 27d to the drain of the device 24d and the gate of the device 22d. The connection from the bitline to the gates of devices 23d and 24d is eliminated as are the connections of the drain terminals of the devices 21 and 22 and the devices 23 and 24. On the other hand, the gates of the two devices 23 and 24 are joined together and to ground.

Thus, any dummy memory cell having a high value applied at its mode terminal furnishes a zero at node B and a discharging path to ground for the dummy bitline whenever the device 26d receives a high value on the dummy wordline.

The present invention provides a large number of advantages. Because the circuitry of the dummy wordline and the dummy column is essentially the same as that of the operating portions of the array, a change in process changes the characteristics of the dummy circuitry in the same manner as it changes the characteristics of the operating portions of the array. This helps to maintain operating characteristics when manufacturing processes changes somewhat.

The ability to select by means of mode inputs any of a number of dummy memory cells allows timing to be varied to exactly match the characteristics of a particular process. Thus, if the timing is slightly off in either direction, the number of dummy memory cells operated may be increased or decreased to obtain more precise timing. This has the added advantage of allowing memory arrays manufactured by processes which produce widely differing charging times to be utilized with the same associated circuitry. Other features and advantages will be appreciated by those skilled in the art.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for generating timing signals for clocking sensing amplifiers of a SRAM memory array having a plurality of operative memory cells joined in rows by wordlines and in columns by bitlines comprising
   a dummy bitline,
   a plurality of dummy memory cells joined to the dummy bitline,
   means for accessing a plurality of the dummy memory cells in parallel to generate a dummy bitline charging value significantly greater than a bitline charging value in an operative column of the SRAM memory array, and
   a circuit responsive to a dummy bitline value for generating sense amplifier timing signals for the memory array.

2. A circuit as claimed in claim 1 in which the plurality of dummy memory cells which may be accessed in parallel is selectable.

3. A circuit as claimed in claim 1 in which the dummy memory cells include devices identical to devices in operative memory cells.

4. A circuit as claimed in claim 1 in which the plurality of dummy memory cells joined to a dummy bitline is equal to operative memory cells joined to a bitline.

5. A circuit as claimed in claim 1 in which some of the plurality of dummy memory cells cannot be accessed and some of the plurality of dummy memory cells can be accessed.

6. A circuit as claimed in claim 1 in which the dummy memory cells cause the dummy bitline to have electrical characteristics equivalent to electrical characteristics of an operative bitline.

7. A circuit as in claim 1 in which the dummy cells are identical to operative memory cells of the array.

8. A circuit as claimed in claim 1 in which the means for accessing a plurality of the dummy memory cells in parallel to generate a bitline charging value significantly greater than a bitline charging value in an operative column of the SRAM memory array comprises a dummy wordline joined to some of the plurality of dummy memory cells, means for selecting certain of the dummy cells to which the dummy wordline is connected, and means for furnishing a wordline enable signal through the dummy wordline whenever the memory array is accessed.

9. A circuit as claimed in claim 8 in which the dummy wordline has the characteristics of an operative wordline in the array.

10. A SRAM memory array comprising:
   a plurality of operative memory cells,
   a plurality of wordlines each connected to the operative memory cells defining an individual row of the array,
   a plurality of pairs of column conductors each connected to the operative memory cells defining an individual column of the array,
   a plurality of sense amplifiers each connected to one pair of the column conductors, and
   a circuit for generating timing signals for clocking the sensing amplifiers comprising:
      a dummy bitline,
      a plurality of dummy memory cells joined to the dummy bit column,
      means for accessing a plurality of the dummy memory cells in parallel to generate a bitline charging value significantly greater than a bitline charging value in an operative column of the SRAM memory array, and
      a circuit responsive to a dummy bitline value for generating sense amplifier timing signals for the memory array.

11. A SRAM memory array as claimed in claim 10 in which the plurality of dummy memory cells which may be accessed in parallel is selectable.

12. A SRAM memory array as claimed in claim 10 in which the dummy memory cells include devices identical to devices in operative memory cells.

13. A SRAM memory array as claimed in claim 10 in which the plurality of dummy memory cells joined to a dummy bitline is equal to operative memory cells joined to a bitline.

14. A SRAM memory array as claimed in claim 10 in which some of the plurality of dummy memory cells cannot be accessed and some of the plurality of dummy memory cells can be accessed.

15. A SRAM memory array as claimed in claim 10 in which the dummy memory cells cause the dummy bitline to have electrical characteristics equivalent to electrical characteristics of an operative bitline.

16. A SRAM memory array as claimed in claim 10 in which the means for accessing a plurality of the dummy memory cells in parallel to generate a bitline charging value significantly greater than a bitline charging value in an operative column of the SRAM memory array comprises a dummy wordline joined to some of the plurality of dummy memory cells, means for selecting certain of the dummy cells to which the dummy wordline is connected, and means for furnishing a wordline enable signal through the dummy wordline whenever the memory array is accessed.

17. A SRAM memory array as claimed in claim 16 in which the dummy wordline has the characteristics of an operative wordline in the array.

* * * * *